US008895362B2

(12) United States Patent
Couillard et al.

(10) Patent No.: US 8,895,362 B2
(45) Date of Patent: Nov. 25, 2014

(54) METHODS FOR BONDING MATERIAL LAYERS TO ONE ANOTHER AND RESULTANT APPARATUS

(71) Applicant: Corning Incorporated, Corning, NY (US)

(72) Inventors: James Gregory Couillard, Ithaca, NY (US); Christopher Paul Daigler, Painted Post, NY (US); Jiangwei Feng, Painted Post, NY (US); Yawei Sun, Horseheads, NY (US); Lili Tian, Corning, NY (US); Ian David Tracy, Horseheads, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 13/775,890

(22) Filed: Feb. 25, 2013

(65) Prior Publication Data

US 2013/0221510 A1 Aug. 29, 2013

Related U.S. Application Data

(60) Provisional application No. 61/604,747, filed on Feb. 29, 2012.

(51) Int. Cl.
| | | |
|---|---|---|
| H01L 23/15 | (2006.01) | |
| H01L 21/82 | (2006.01) | |
| B81C 3/00 | (2006.01) | |
| G02B 26/08 | (2006.01) | |

(52) U.S. Cl.
CPC ............... *H01L 21/82* (2013.01); *H01L 23/15* (2013.01); *B81C 3/001* (2013.01); *G02B 26/0833* (2013.01); *B81C 2203/035* (2013.01); *B81C 2201/019* (2013.01); *B81C 2203/032* (2013.01)
USPC ............. 438/113; 438/459; 438/455; 438/47; 257/685

(58) Field of Classification Search
USPC ..................... 438/113, 459, 455, 47; 257/685
See application file for complete search history.

(56) References Cited

U.S. PATENT DOCUMENTS

| | | |
|---|---|---|
| 3,397,278 A | 8/1968 | Pomerantz |
| 6,537,892 B2 | 3/2003 | Jordan et al. |

(Continued)

FOREIGN PATENT DOCUMENTS

| | | |
|---|---|---|
| CA | 2374698 | 12/2000 |
| WO | 2009082516 | 7/2009 |

(Continued)

OTHER PUBLICATIONS

S. Farrens, "Vertical Integration: A Confederacy of Alignment, Bonding and Materials Technologies", Materials Research Society Symposium Proceedings, V.970, Fall 2006, p. 215-223.

(Continued)

*Primary Examiner* — S. V. Clark
*Assistant Examiner* — Krista Soderholm
(74) *Attorney, Agent, or Firm* — Timothy M Schaeberle

(57) ABSTRACT

Methods and apparatus provide for a structure, including: a first glass material layer; and a second material layer bonded to the first glass material layer via bonding material, where the bonding material is formed from one of glass frit material, ceramic frit material, glass ceramic frit material, and metal paste, which has been melted and cured.

20 Claims, 5 Drawing Sheets

(56) References Cited

U.S. PATENT DOCUMENTS

| | | |
|---|---|---|
| 6,998,776 B2* | 2/2006 | Aitken et al. ............... 313/512 |
| 2002/0106862 A1 | 8/2002 | Jordan et al. |
| 2003/0075794 A1 | 4/2003 | Felton et al. |
| 2005/0266252 A1* | 12/2005 | Rita ............... 428/432 |
| 2009/0194828 A1 | 8/2009 | Cobianu et al. |
| 2010/0043494 A1 | 2/2010 | Gascon et al. |
| 2011/0008593 A1 | 1/2011 | Abbott, Jr. et al. |
| 2011/0073880 A1* | 3/2011 | Lee et al. ............... 257/88 |
| 2012/0111059 A1 | 5/2012 | Watanabe et al. |

FOREIGN PATENT DOCUMENTS

| | | |
|---|---|---|
| WO | 2011-010489 | 1/2011 |
| WO | 2011005952 | 1/2011 |

OTHER PUBLICATIONS

Kanda et al; "The Mechanism of Field-Assisted Silicon-Glass Bonding"; Sensors and Actuators, A21-A23 (1990) 939-943.

W. H. Ko, J. T. Suminto, and G. J. Yeh, "Bonding Techniques for Microsensors", In *Micromachining and Micropackaging for Transducers*, Amsterdam, The Netherlands: Elsevier, 1985.

Lee et al; "A Batch-Fabricated Silicon Capacitive Pressure Transducer With Low Temperature Sensitivity"; IEEE Transations on Electron Devices, vol. ED-29 No. 1, Jan. 1982 p. 42-48.

C.R. Liu, J.F. Zhao, X.Y. Lu, Q. S. Meng, Y. P. Zhao, Z. A. Munir, "Field-Assisted Diffusion Bonding and Bond Characterization of Glass to Aluminum", J. Mater, Sci, V. 43, p. 5076-5082, 2008.

Liu et al; "Wafer Bonding for High-Brightness Light-Emitting Diodes Via Indium Tin Oxide Intermediate Layers"; Thin Solid Films 478 (2005) 280-285.

Puers et al; "A Capacitive Pressure Sensor With Low Impedance Output and Active Suppression of Parasitic Effects" Sensor and Actuators, A21-A23 (1990) 108-114.

Rogert et al; "Selection of Glass, Anodic Bonding Conditions and Material Compatibility for Silicon-Glass Capactivie Sensors"; Sensors and Actuators A 46-47 (1995) 113-120.

Rudolf et al; Precision Accelerometers With μG Resolution; Sensors and Actuators, A21-A23 (1990) 297-302.

S. Sassen, W. Kupke, K. Bauer, "Anodic Bonding of Evaporated Glass Structured With Lift-Off Technology for Hermetical Sealing", Sensors and Actuators, V. 83, p. 150-155, 2000.

M. A. Schmidt, "Wafer-To-Wafer Bonding for Microstructure Formation", Proc. IEEE, V.86, p. 1575-1585, Aug. 1998.

Rao R. Tummala, Eugene J. Rymaszewski, Alan G. Klopfenstein, Microelectronics Packaging Handbook: Semiconductor Packaging, p. II-123. Copyright @ 1997 by Chapman & Hall, Third Printing 2004 by Kluwer Academics Publisher.

Xiao et al; "Silicon Micro-Accelerometer With MG Resolution, High Linearity and Large Frequency Bandwidth Fabricated With Two Mask Bulk Process"; Senors and Actuators 77 (1999) 113-119.

Yu et al; "The Anodic Bonding Between K4 Glass and Si"; Materials Letters 59 (2005) 2492-2495.

Knechtel; "Glass Frit Bonding: An Universal Technology for Wafer Level Encapsulation and Packaging"; Microsyst Technol (2005) 12: 63-68.

Ribeiro et al; "Laser Assisted Glass Frit Sealing of Dye-Sensitized Solar Cells"; Solar Energy Materials & Solar Cells; 96 (2012) 43-49.

PCT/US2013/024977 Search Report.

\* cited by examiner

100

400

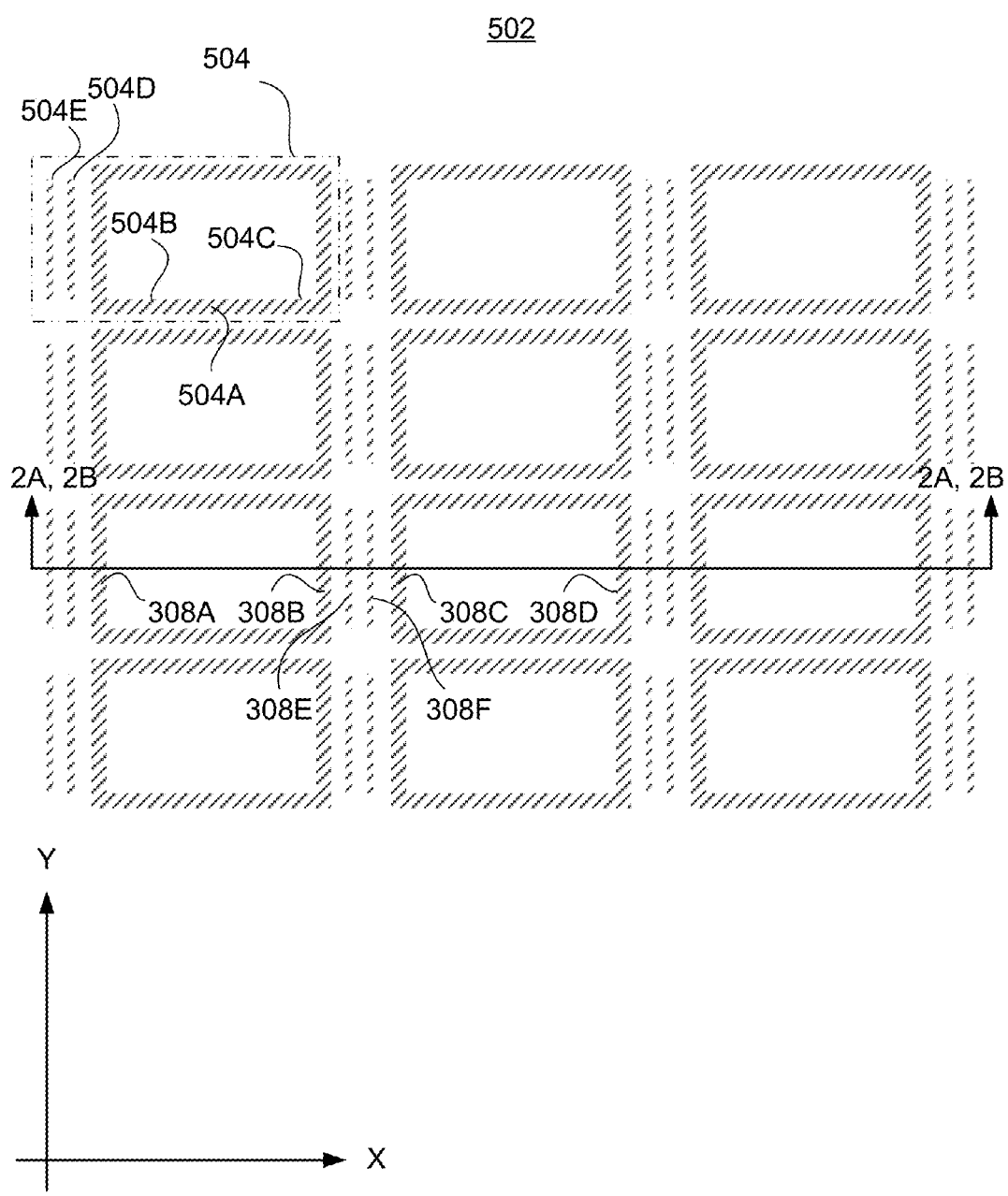

METHODS FOR BONDING MATERIAL LAYERS TO ONE ANOTHER AND RESULTANT APPARATUS

This application claims the benefit of priority under U.S.C. §119 of U.S. Provisional Application Ser. No. 61/604,747 filed on Feb. 29, 2012 the content of which is relied upon and incorporated herein by reference in its entirety.

BACKGROUND

The features, aspects and embodiments disclosed herein relate to the manufacture of devices in which one material layer is to be coupled to another layer, such as in device packaging applications, yielding improved methods and apparatus.

Wafer bonding techniques have been employed to create seals for semiconductor packaging systems for decades. Some known wafer bonding techniques may include an intermediate layer between two material layers, and may be characterized as employing organic adhesive bonding, such as UV curable organic epoxy glue. While this bonding technique has been described in the art as providing a hermetic seal, in practice the degree of hermeticity varies among the techniques and as a function of the environment to which the seal is exposed. The results are unsatisfactory for certain applications, especially long term moisture exposure.

It has been discovered that a screen printing process may be employed to apply a glass and/or ceramic frit paste or a metal solder paste to one or more surfaces of a layered material structure, followed by heating steps to bond one or more of the layers together to achieve a hermetic seal.

SUMMARY

By way of example, there is a need for improvement in the bonding characteristics and hermeticity achieved during the formation of micro-electromechanical system (MEMS) structures.

One such MEMS is a digital light processor (DLP™), which is a micro-display projection element capable of producing light in accordance with control signaling. A plurality of the DLPs may be packaged in, for example, a digital projector in order to provide image projecting capability to a user. A DLP element includes a glass element (cover glass) to protect the delicate MEMS structures located behind the glass. In particular, the DLP element employs an array of small mirrors on a semiconductor chip (usually silicon) to reflect light from a projection lamp to form an image. The cover glass protects these structures. The cover glass includes two pieces of layered glass: a layer of front glass (which may be on the order of about 0.3-1.1 mm thick), and an interposer layer of glass. A patterned black matrix coating (e.g., a Cr stack) is deposited on one side of the front glass to define a window aperture for the DLP projector element. A uniform anti-reflection (AR) coating film stack is located on both sides of the front glass. The interposer layer is typically bare glass.

In existing processes, a relatively large sheet of front glass (e.g., a 200 mm diameter glass wafer, which is much larger than an individual DLP element) is bonded to a relatively large, patterned sheet of interposer layer glass (e.g., also on the order of about 200 mm diameter wafer). The patterned interposer sheet includes a plurality of apertures therethrough, each aperture for eventual registration with the MEMS structure of an individual DLP element. A typical manufacturing process to achieve the apertures through the patterned interposer sheet may employ machining and/or etching. The sheet of front glass is bonded to the sheet of interposer layer glass by way of ultra-violet (UV) cured organic epoxy. This intermediate glass structure is bonded to a semiconductor wafer (e.g., a 200 mm diameter silicon wafer), which includes a plurality of MEMS structures thereon, such that each MEMS structure is in registration with a respective one of the apertures through the sheet of interposer layer glass. In other words, the intermediate glass structure is bonded to an intermediate MEMS structure at the semiconductor wafer level. More specifically, the glass structure is bonded to the semiconductor wafer also using ultraviolet (UV) cured organic epoxy. At this point, respective sets of electrical die pads for each individual MEMS structure are located beneath the interposer sheet of the intermediate glass structure.

After bonding to wafer-level MEMS structures, the entire stack is diced in order to obtain a plurality of individual DLP elements (with respective sets of electrical die pads exposed) for packaging into the final DLP projector chip. In a typical application, there may be on the order of about 80 to 600 such DLP elements produced after dicing.

There are a number of significant requirements that must be considered and met during the process of bonding the front glass to the interposer layer glass, and of bonding the intermediate glass structure (specifically the interposer layer glass thereof) to the semiconductor wafer containing the MEMS structures. These requirements include: (1) that the front glass and the interposer layer glass materials are UV transparent for downstream sealing processes; (2) that the bonding between the front glass and the interposer layer glass is hermetic; (3) that the bonding material (creating the hermetic seal) is chemically compatible with materials used in the MEMS structures and downstream processes; (4) that the flatness of the intermediate glass structure (i.e., the front glass bonded to the interposer layer glass) is better than 150 µm; and (5) that the entire wafer-level stack (i.e., the intermediate glass structure bonded to the semiconductor wafer containing the MEMS elements) is compatible with wafer level dicing.

It has been discovered that the UV-curable epoxy bonding technique used in conventional processes to bond the sheet of front glass to the sheet of interposer glass does not reliably provide a hermetic seal, especially as to moisture, which may lead to DLP device failure. Indeed, it has been found that an adhesive polymer bonding permeation rate is about $10^{-6}$ cc/sec. In accordance with one or more embodiments disclosed and/or described herein, however, it has been discovered that a hermetic seal may be achieved between the front glass and the sheet of interposer glass using a new bonding process.

In this regard, one or more embodiments may employ a raw bonding material disposed onto a first surface of one or both of the front glass and the interposer glass material layers, where: (i) the disposition is carried out using screen printing to produce a pattern of the raw bonding material onto the front glass and/or the interposer glass material layers, and (ii) the raw bonding material is formed from one of glass frit material, ceramic frit material, glass ceramic frit material, and metal paste. Thereafter, the front glass and/or the interposer glass material layers on which the pattern has been disposed are heated to a temperature (or temperatures) sufficient to burn out organic materials that may be present. Next, the front glass and/or the interposer glass material layers are heated in excess of a melting temperature of the raw bonding material such that the raw bonding material melts and becomes glazed to the front glass and/or the interposer glass material layers.

Next, the front glass and the interposer glass material layers are pressed together. In the case where the pattern of bonding material is disposed only on one or the other of the front glass and the interposer glass material layers, then just prior to pressing, the front glass and the interposer glass material layers are carefully located such that the pattern properly registers about and around each of the apertures of the interposer glass material layer. Of course, if the pattern of bonding material is disposed only on the interposer glass material layers, the registration of the bonding material will have already been obtained during the screen printing of the bonding material on the interposer glass material layer. In the case where respective patterns of bonding material are disposed on each of the front glass and the interposer glass material layers, then just prior to pressing, the respective patterns are carefully aligned in registration with one another. During and/or after pressing, the front glass and the interposer glass material layers are further heated to re-melt the bonding material and bond the front glass and the interposer glass material layers together.

It should be noted that the use of inorganic frit materials (such as glass and/or ceramic frit) and metal paste have been employed in other contexts to create hermetic seals. However, there are significant reasons why skilled artisans have not heretofore employed such materials in the context of producing the aforementioned DLP micro-display projection elements. Among these reasons is that neither inorganic frit nor metal paste materials are UV transparent (which was one of the noted requirements in the process of manufacturing such DLPs). Additionally, because the respective coefficients of thermal expansion of inorganic frit material and metal solder are usually quite different from that of glass, there is no known screen printing pattern that is suitable for applying such bonding materials to either of the front glass and/or interposer glass material layers. Indeed, due to CTE mismatches, if great care is not taken to design a suitable bonding pattern, then the bonds may fail and/or the flatness of the resultant bonded intermediate glass structure may be outside an acceptable range. Thus, the design of the bonding pattern (and thus the screen) becomes extremely important for wafer level packaging process.

The embodiments disclosed and/or described herein provide for a hermetic seal between the front glass and the interposer glass material layers at the wafer level, which also meet all the other important requirements for downstream processing listed above.

Other aspects, features, advantages, etc. will become apparent to one skilled in the art when the description of the embodiments herein is taken in conjunction with the accompanying drawings.

BRIEF DESCRIPTION OF THE DRAWINGS

For the purposes of illustrating the various aspects and features disclosed herein, there are shown in the drawings forms that are presently preferred, it being understood, however, that the covered embodiments are not limited to the precise arrangements and instrumentalities shown.

FIG. 5 is a detailed view of a portion of a pattern of bonding material that may be disposed on a surface using the portion of the screen of FIG. 4.

DETAILED DESCRIPTION

Figure 1:
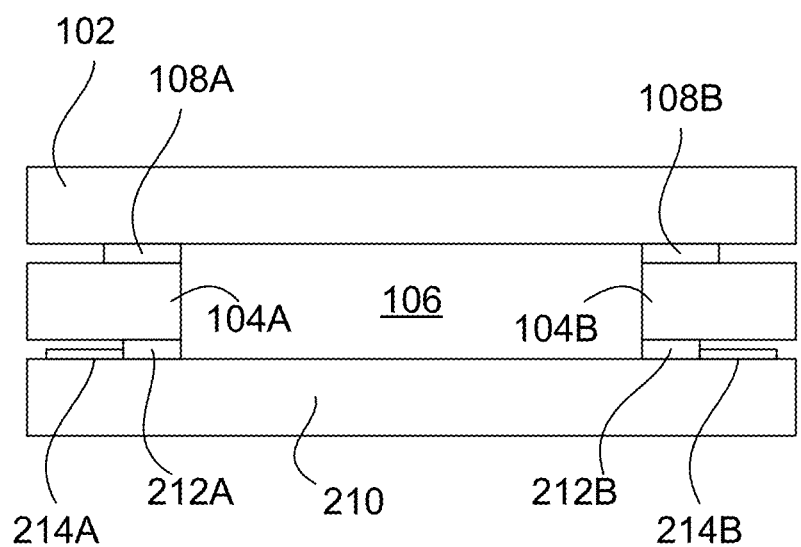
FIG. 1 is a block diagram illustrating the structure of a micro-display projection element in accordance with one or more embodiments disclosed herein.

With reference to the drawings, wherein like numerals indicate like elements, there is shown in FIG. 1 a bonded structure 100 in accordance with one or more embodiments disclosed herein. The structure 100 is shown in an elevational, schematic view, and may be used in any suitable application, such as in the formation of one or more DLP devices.

The structure 100 includes a first material layer 102, e.g., formed of transparent insulator material, such as glass, glass-ceramic, etc. In the context of forming a DLP device, the first material layer 102 may be the front glass material layer 102. The structure 100 also includes a second material layer 104 that has been formed from a patterned sheet of transparent insulator material, such as glass, glass-ceramic, etc. The patterning is such that one or more apertures 106 (only one being shown) extend therethrough, where each aperture 106 is circumscribed by respective walls (only walls 104A and 104B being visible in the view shown). In the context of forming a DLP device, the second material layer 104 may the interposer glass material layer 104 (the basic structure of which was discussed above). The aperture 106 and corresponding walls 104A, 104B define a window area for the respective DLP device 100. The front glass material layer 102 is bonded to the interposer glass material layer 104 by way of a pattern of bonding material 108, whereby only sections thereof 108A, 108B are visible in the elevational view.

The structure 100 also includes a semiconductor layer 210, which is coupled to the interposer glass material layer 104 and is in registration with the aperture 106. In the context of manufacturing a DLP device, the semiconductor layer 210 may be a micro-electromechanical system (MEMS) 210. The interposer glass material layer 104 is bonded to the MEMS 210 by way of ultraviolet (UV) cured organic epoxy, only sections 212A, 212B being visible in the elevational view. A number of electrical die pads (214A, 214B being visible) for the MEMS 210 are located beneath the interposer glass material layer 104, between that layer and the MEMS 210. In this way, light may be directed from the respective MEMS 210 through the aperture 106 and through the front glass material layer 102. In order to improve the optical properties of the light transmission from the MEMS 210 and through the first material layer 102, the layer 102 may be coated on one or both sides with an AR coating.

Reference is now made to FIGS. 2A-2E, which illustrate methods and structures that may be employed in manufacturing the structure 100 of FIG. 1. With specific reference to FIGS. 2A-2B, the manufacturing process may include disposing raw bonding material 308 onto a first surface of one, or both, of the first and second glass material layers 302, 304.

In the context of forming the aforementioned structure 100 (such as a DLP element), the first glass material layer 302 may be a front glass material layer 302 that is significantly larger (in surface area as opposed to thickness) than the front glass material layer 102 of the individual structure 100 of FIG. 1 (which, again, may be a single DLP element). For example, the front glass material layer 302 may be on the order of about 200 mm in diameter (although other sizes may be employed). Similarly, the second glass material layer 304 may be an interposer glass material layer 304 that is significantly larger (in surface area as opposed to thickness) than the interposer material layer 104 of the individual structure 100. For example, the interposer glass material layer 304 may also be on the order of about 200 mm in diameter (where, again, other sizes may be employed).

It is preferred that the raw bonding material 308 is formed from glass frit material, ceramic frit material, glass ceramic frit material, or metal paste. The disposition of the raw bonding material 308 onto the first surface of one, or both, of the front and interposer glass material layers 302, 304 is carried out using a screen printing process to produce a pattern of the raw bonding material (represented by the individual traces of raw bonding material 308A, 308B, 308C, etc.). As discussed above, due to CTE mismatches, if great care is not taken to design a suitable bonding pattern in which to dispose the raw bonding material 308, then the resultant bonds may fail and/or the flatness of the resultant bonded intermediate glass structure may be outside an acceptable range. Thus, the design of the bonding pattern (and thus a screen for applying the bonding pattern) becomes extremely important for wafer level packaging process.

Figure 3:
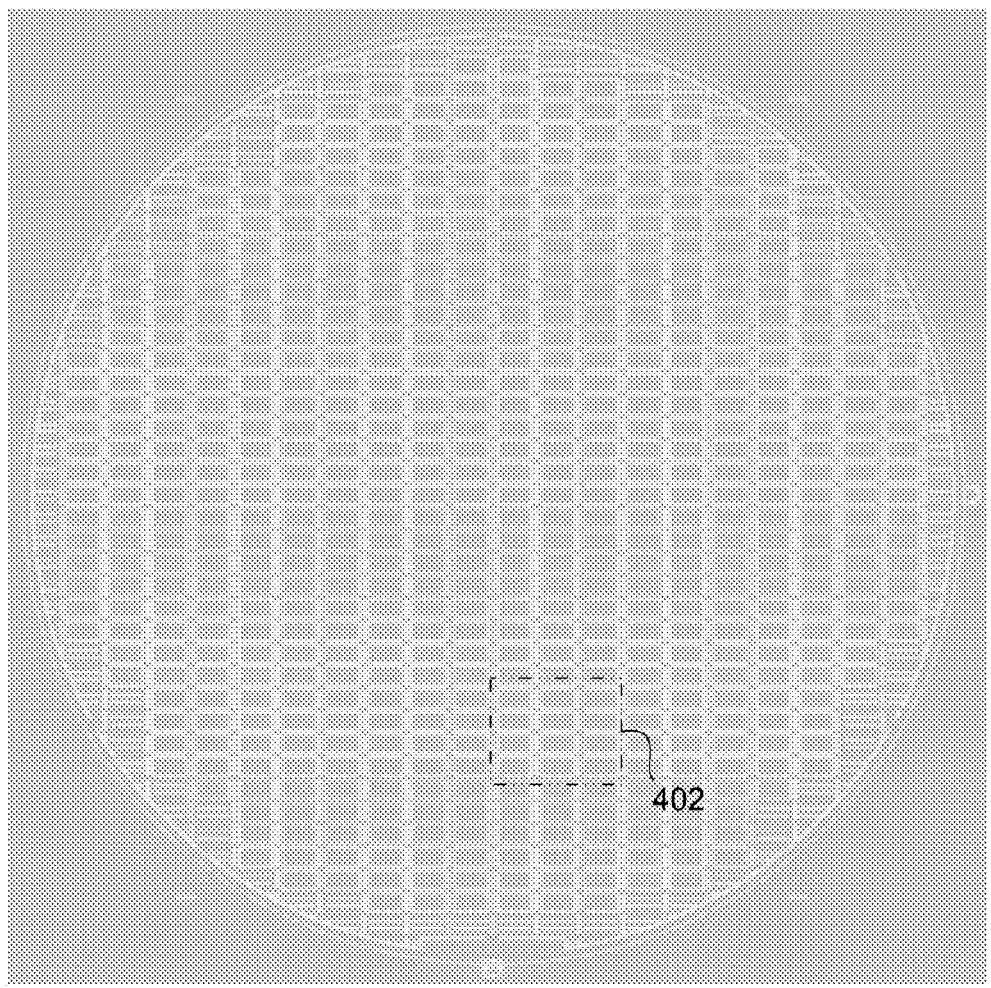
FIG. 3 is a schematic diagram illustrating a suitable screen for use in the process of forming intermediate bonded structures during the manufacture of the device of FIG. 1.
Figure 4:
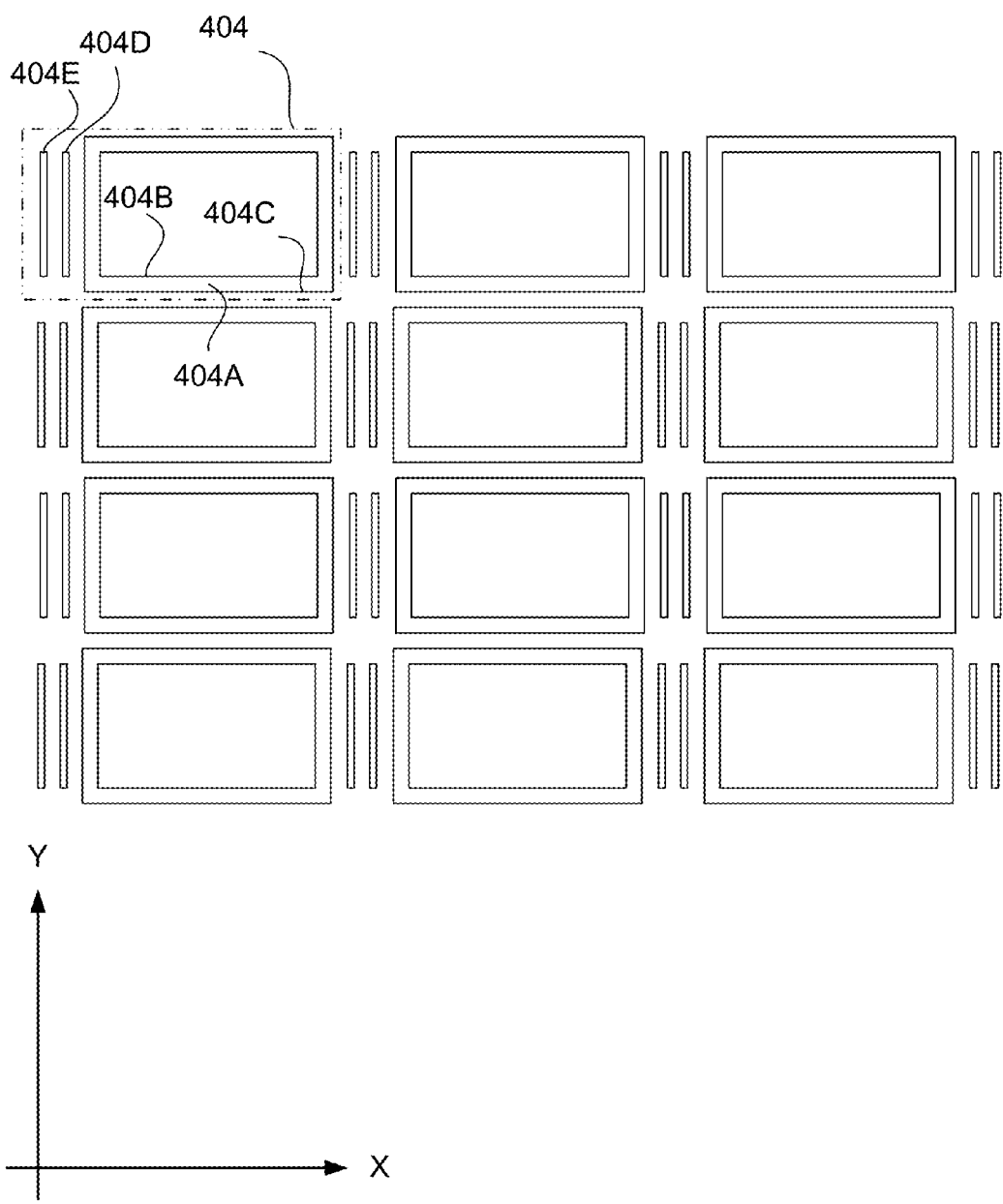
FIG. 4 is a more detailed view of a portion (A) of the screen of FIG. 3.

Reference is now made to FIGS. 3, 4, and 5 in connection with describing various aspects of a screen and bonding pattern. FIG. 3 is a schematic diagram illustrating a suitable screen 400 for use in depositing the raw bonding material 308 onto one or both of the front and interposer glass material layers 302, 304. The screen 400 is preferably on the order of the same surface area as the front and interposer glass material layers 302, 304, which may be on the order of about 200 mm diameter. The basic materials used to form the screen 400 may be conventional, although the configuration of the sizes, shapes and orientations of the screen openings are not conventional at all. Thus, the basic construction of the screen 400 may include a stainless steel wire mesh that supports an emulsion layer. The emulsion layer may be formed using photo-imaging techniques to produce a plurality of screen openings through which the raw bonding material 308 is applied to the front and/or interposer glass material layers 302, 304. The screen openings are arranged in a novel pattern, which has been found to achieve desirable bonding properties in finished products.

The pattern of screen openings in the screen 400 is best seen in FIG. 4, which shows a more detailed view of a portion 402 of the screen 400 of FIG. 3. The portion 402 includes a repeating pattern (or cell) 404 of screen openings, which preferably covers as much of the screen 400 as possible.

The pattern includes an X-Y directional array of the cells 404, each cell 404 being characterized by a continuous rectangular perimeter screen opening 404A. The size and shape of the continuous rectangular perimeter screen opening 404A is preferably complementary to the array of apertures 306 through the interposer glass material layer 304, for example the apertures 306A, 306B, 306C shown in cross-section in FIG. 2B. The complementary characteristics of the continuous rectangular perimeter screen opening 404A may include one or more of: (i) that an inner peripheral edge 404B of the opening 404A is substantially the same, or slightly greater, size as a corresponding periphery of the aperture 306; and (ii) that the shape circumscribed by the inner peripheral edge 404B and/or the outer peripheral edge 404C of the opening 404A is substantially the same as the shape of the aperture 306 (in this case a rectangular shape).

The pattern may additionally or alternatively be characterized in that adjacent cells 404 in the X-direction are separated by at least one linear screen opening 404D (e.g., to form a tie bar which will be discussed later herein). As will be discussed in more detail later, it has been found particularly advantageous for the pattern to characterized in that adjacent cells 404 in the X-direction are separated by at least two parallel linear screen openings 404D, 404E. It has been found during experimentation that the pattern of screen openings 404 need not include any linear screen openings between adjacent cells 404 in the Y-direction. It is noted however, that such linear screen openings may be employed and would likely assist in improving a number of characteristics of the bonding process.

The mesh screen openings in the screen 400 are designed to accommodate the particle size of the raw bonding material 308 (such as the glass and/or ceramic frit material), to allow the raw bonding material 308 to be pushed through every screen opening in the screen 400, and to provide for material thickness uniformity, preferably 10 μm. Due to the relatively high viscosity glass and/or ceramic frit material, a screen 400 of at least 40% open area, preferably at least 50% open area, or more preferred at least 60% open area, is used. Such open area characteristics are preferably used in conjunction with fine wire diameter to produce the mesh of the screen 400 in order to print the raw bonding material 308 (particularly glass and/or ceramic frit material) in the desired uniform manner. For example, the wire diameter of no more than about 40 μm, preferably no more than about 30 μm, and more preferably no more than about 20 μm, is to be used to produce the mesh of the screen 400. In addition, the materials used to produce the screen 400 should be low elongation material (about 8% or less, preferably about 5% or less) in relation to stretching the screen 400 to the proper tension for screen printing.

FIG. 5 is a detailed view of a portion of a bonding pattern 502 of raw bonding material 308 that results from using the screen 400, specifically the portion 402 of the screen 400 shown in FIG. 4. When one or more of the above-noted considerations are taken into account in producing the mesh 400, the resulting pattern of the raw bonding material 308 should have a thickness uniformity of about 10 μm or better. As one might expect, given the geometric properties of the screen openings of the cells 404, the pattern of raw bonding material 308 is also characterized by an X-Y directional array of cells 504, each cell 504 being characterized in similar ways as the cells 404 of the screen 400.

Figure 2A:
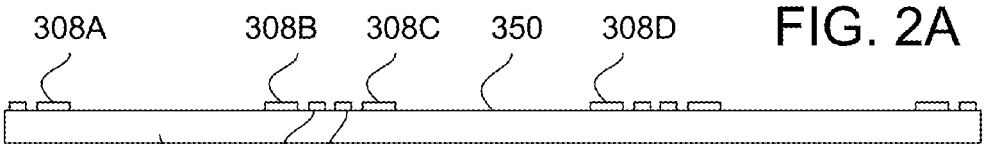
FIGS. 2A-2E illustrate methods and structures that may be employed in manufacturing the device of FIG. 1.

For example, each cell 504 in the pattern of raw bonding material 308 may include a continuous rectangular perimeter 504A of the raw bonding material 308. The size and shape of the continuous rectangular perimeter 504A of the raw bonding material 308 is preferably complementary to the array of apertures 306 through the interposer glass material layer 304. For example, the raw bonding material 308 may be screen printed onto the surface of the front glass material layer 302 (FIG. 2A). When looking at the printed raw bonding material 308 in cross section through line 2A-2A of FIG. 5 (which corresponds to the view shown in FIG. 2A), the respective segments of the raw bonding material 308 making up the continuous rectangular perimeter 504A (for example, segments 308A and 308B) are complementary to an associated aperture 306 (for example, aperture 306A shown in cross-section in FIG. 2B).

Figure 2B:
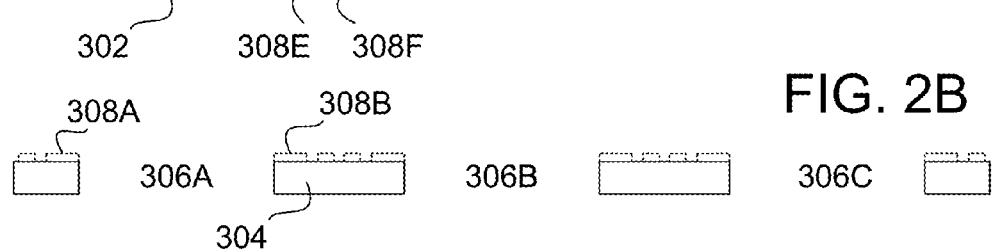

Additionally or alternatively, the raw bonding material 308 may be screen printed onto the surface of the interposer glass material layer 304 (FIG. 2B). When looking at the printed raw bonding material 308 in cross section through line 2B-2B of FIG. 5 (which corresponds to the view shown in FIG. 2B), the respective segments of the raw bonding material 308 making up the continuous rectangular perimeter 504A (for example, segments 308A and 308B) are also complementary to the associated aperture 306A.

More generally, the complementary characteristics of the continuous rectangular perimeter 504A may include one or more of: (i) that an inner peripheral edge 504B of the raw bonding material 308 is substantially the same, or slightly greater, size as a corresponding periphery of the aperture 306; and (ii) that the shape circumscribed by the inner peripheral edge 504B and/or the outer peripheral edge 504C of the raw bonding material 308 is substantially the same as the shape of the aperture 306 (in this case a rectangular shape). One or more of the above-noted complementary characteristics of the cell 504 of the pattern and the apertures 306 preferably result in current or later registration of a continuous rectangular perimeter 504A of raw bonding material 308 about each of the apertures 306.

The pattern may additionally or alternatively be characterized in that adjacent cells 504 of raw bonding material 308 in the X-direction are separated by at least one linear tie bar 504D of raw bonding material 308. As will be discussed in more detail later, it has been found particularly advantageous for the pattern to characterized in that adjacent cells 504 in the X-direction are separated by at least two parallel linear tie bars 504D, 504E. It has been found during experimentation that the pattern of adjacent cells 504 in the Y-direction need not include any tie bars, although such tie bars may be employed if desired.

It is also noted that dispensing techniques (as opposed to screen printing) may be modified and employed to create the raw bonding material pattern 502 described above.

Turning again to FIGS. 2A and 2B, after the raw bonding material 308 is disposed (e.g., screen printed) onto one or both of the front and/or interposer glass material layers 302, 304, such layer(s) are heated to a temperature (or temperatures) sufficient to burn out organic materials that may be present. Next, such layer(s) are further heated in excess of a melting temperature of the raw bonding material 308 such that the raw bonding material 308 melts and becomes glazed to the first and/or second glass material layers.

Figure 2C:
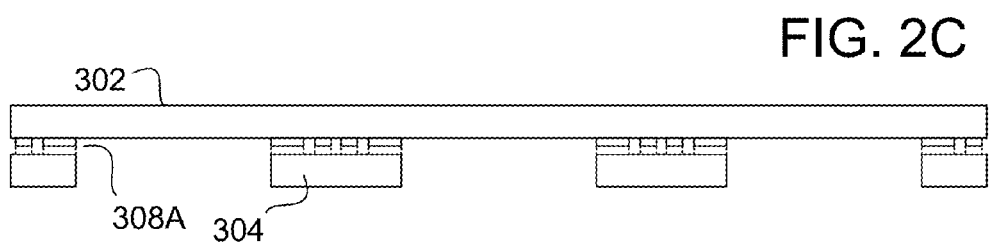

With reference to FIG. 2C, thereafter the front and interposer glass material layers 302, 304 are brought into registration with one another such that the pattern (or patterns) of glazed bonding material is disposed therebetween. When, for example, the raw bonding material 308 was screen printed only onto the surface of the front glass material layer 302 and then glazed, the registration of the front and interposer glass material layers 302, 304 involves ensuring that the continuous rectangular perimeter 504A of the glazed bonding material of each cell 504 (which are only on the front glass material layer 302) are in registration with corresponding apertures 306 of the interposer glass material layer 304.

When the raw bonding material 308 is screen printed only onto the surface of the interposer glass material layer 304 and then glazed, the continuous rectangular perimeter 504A of the glazed bonding material of each cell 504 should already be in registration with corresponding apertures 306 of the interposer glass material layer 304. Thus, the registration of the front and interposer glass material layers 302, 304 involves ensuring that such layers are aligned in a macroscopic sense.

When, however, the raw bonding material 308 is screen printed onto both the front glass material layer 302 and the interposer glass material layer 304 and then glazed, the registration should ensure that the respective patterns of glazed bonding material (which are disposed both glass layers 302, 304) are aligned and in registration with one another.

Once the above-discussed registration is achieved, the front and interposer glass material layers 302, 304 are pressed together (FIG. 2C). Next, the front and interposer glass material layers 302, 304 are further heated, preferably while maintaining the pressing action, to re-melt the glazed bonding material and bond the front and interposer glass material layers 302, 304 together. Notably, the characteristics of the resulting intermediate glass structure of FIG. 2C includes hermetic properties (i.e., in the bond between the layers 302, 304), and a flatness of about 0.75 µm per mm or better, preferably about 0.4 µm per mm or better. Such flatness is achieved, at least in part, by using the tie bars 504E, 504F of bonding material 308, by using uniformity in thickness of the bonding material 308, and/or by using suitable widths for the traces of the raw bonding material 308 resulting from the screen printing process.

Figure 2D:
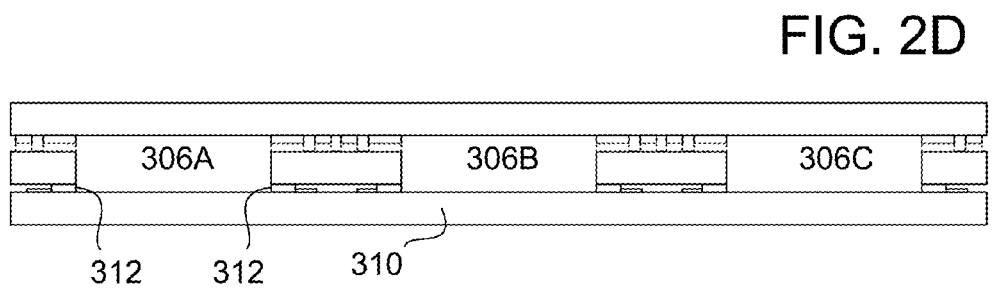

Although not required to practice some embodiments, the process may further include producing a wafer-level structure by bonding the intermediate glass structure (FIG. 2C) to another structure, such as a semiconductor wafer 310 (FIG. 2D). The semiconductor wafer 310 may include many semiconductor die defined thereon. In keeping with the example of producing a structure 100 (such as a DLP device), the semiconductor wafer 310 may be a silicon wafer 304 containing many MEMS devices (die), and may be significantly larger (in surface area as opposed to thickness) than the semiconductor MEMS layer 210 of the individual structure 100 shown in FIG. 1. For example, the MEMS layer 304 may be on the order of about 200 mm in diameter (although, again, other sizes may be employed).

More particularly, a second surface, opposite to the first surface, of the interposer glass material layer 304 may be bonded to the MEMS layer 310. The bonding mechanism may be achieved using ultra-violet (UV) cured organic epoxy 312. Irrespective of the particular bonding technique, each aperture 306 of the interposer glass material layer 304 should be in registration over a respective one of the semiconductor die, e.g., respective MEMS.

Thereafter the wafer level (stacked) structure is diced into a plurality of die, each die including a layered structure comprising a respective one of the semiconductor die (e.g., MEMS die), a respective portion of the interposer glass material layer, a respective aperture therethrough, and a respective portion of the front glass material layer (which forms a cover glass over the aperture).

During dicing, the wafer level (stacked) structure may be mounted on dicing tape, which has a sticky backing that holds the structure on a thin sheet metal frame. The actual dicing process can be accomplished by scribing and breaking, by mechanical sawing (normally with a machine called a dicing saw) or by laser cutting. Once a wafer structure has been diced, the pieces left on the dicing tape are referred to as die, dice or dies. The die may remain on the dicing tape until they are removed by die handling equipment, such as a die bonder or die sorter, in a later electronics assembly process.

Figure 2E:
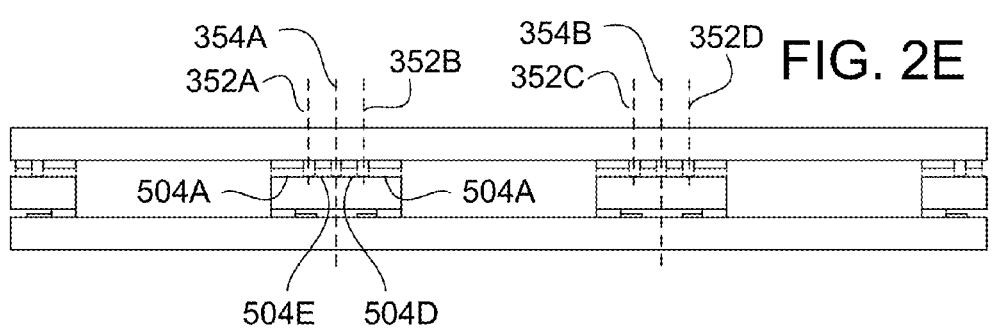

With reference to FIG. 2E, the dicing process may include sawing through the front glass material layer 302, but not through the interposer glass material layer 304 or the MEMS layer 310, along respective lines 352A, 352B, 352C, 352D, etc. These initial sawing lines are preferably between respective tie bars 504D, 504E, and adjacent to portions of the rectangular perimeters of bonding material 504A such that the sawing does not cut through any of the tie bars. Thereafter, the dicing process includes sawing through the front glass material layer 302, but not through the interposer glass material layer 304, or the MEMS layer 310, along lines 354A, 354B, etc., which lines are between respective pairs of adjacent tie bars 504D, 504E (but without sawing through any of the tie bars). Finally, the die are singulated by cutting through the interposer glass material layer 304 and through the MEMS layer 310 along the lines 354. The resulting die are of the structure illustrated in FIG. 1.

Although the aspects, features, and embodiments disclosed herein have been described with reference to particular details, it is to be understood that these details are merely illustrative of broader principles and applications. It is therefore to be understood that numerous modifications may be made to the illustrative embodiments and that other arrangements may be devised without departing from the spirit and scope of the appended claims.

The invention claimed is:

1. A method, comprising:
disposing raw bonding material onto a first surface of one or both of first and second glass material layers, wherein: (i) the disposition is carried out using screen printing to produce a pattern of the raw bonding material onto the first and/or second glass material layers, and (ii) the raw bonding material is formed from one of glass frit material, ceramic frit material, glass ceramic frit material, and metal paste;
heating the first and/or second glass material layers on which the pattern has been disposed to a temperature sufficient to burn out organic materials that may be present;
further heating the first and/or second glass material layers in excess of a melting temperature of the raw bonding material such that the raw bonding material melts and becomes glazed to the first and/or second glass material layers;
pressing the first and second glass material layers together such that: (i) the pattern or patterns of bonding material is disposed therebetween, and (ii) when respective patterns of melted bonding material are disposed on the first and second glass material layers, aligning the respective patterns of melted bonding material in registration with one another prior to the pressing step; and
further heating the first and second glass material layers, while maintaining the pressing action, to re-melt the bonding material and bond the first and second glass material layers together, wherein a resultant flatness of the bonded first and second glass material layers is one of: (i) about 0.75 µm per mm or better; and (ii) about 0.4 µm per mm or better.

2. The method of claim 1, wherein the pattern of the raw bonding material has a thickness uniformity of about 10 µm or better.

3. The method of claim 1, wherein the bond between the first and second glass material layers is hermetic.

4. The method of claim 1, wherein the pattern includes an X-Y directional array of cells, each cell being characterized by a continuous rectangular perimeter of the raw bonding material.

5. A method, comprising:
disposing raw bonding material onto a first surface of one or both of first and second glass material layers, wherein: (i) the disposition is carried out using screen printing to produce a pattern of the raw bonding material onto the first and/or second glass material layers, and (ii) the raw bonding material is formed from one of glass frit material, ceramic frit material, glass ceramic frit material, and metal paste;
heating the first and/or second glass material layers on which the pattern has been disposed to a temperature sufficient to burn out organic materials that may be present;
further heating the first and/or second glass material layers in excess of a melting temperature of the raw bonding material such that the raw bonding material melts and becomes glazed to the first and/or second glass material layers;
pressing the first and second glass material layers together such that: (i) the pattern or patterns of bonding material is disposed therebetween, and (ii) when respective patterns of melted bonding material are disposed on the first and second glass material layers, aligning the respective patterns of melted bonding material in registration with one another prior to the pressing step; and
further heating the first and second glass material layers, while maintaining the pressing action, to re-melt the bonding material and bond the first and second glass material layers together, wherein:
the pattern includes an X-Y directional array of cells, each cell being characterized by a continuous rectangular perimeter of the raw bonding material;
the second glass material layer includes an array of apertures therethrough; and
the continuous rectangular perimeter of the raw bonding material of each cell is in registration with a respective one of the apertures of the second glass sheet at least one of: (i) when the first and second glass material layers are pressed together, and (ii) when the raw bonding material is disposed on the second glass material layer using screen printing.

6. The method of claim 5, wherein a resultant flatness of the bonded first and second glass material layers is one of: (i) about 0.75 µm per mm or better; and (ii) about 0.4 µm per mm or better.

7. The method of claim 5, wherein the pattern is further characterized by adjacent cells in the X-direction being separated by at least one line of raw bonding material (tie bar).

8. The method of claim 7, wherein:
the pattern includes two parallel tie bars of raw bonding material between each adjacent cell; and
the pattern does not include any tie bars of raw bonding material between adjacent cells in the Y-direction.

9. The method of claim 8, further comprising producing a wafer-level structure by bonding a second surface, opposite to the first surface, of the second glass material layer to a semiconductor wafer comprising an array of semiconductor die such that each aperture of the second glass material layer is in registration over a respective one of the semiconductor die.

10. The method of claim 9, further comprising dicing the wafer level structure into a plurality of die, each die including a layered structure comprising a respective one of the semiconductor die, a respective portion of the second glass material layer and respective aperture therethrough forming an interposer layer, and a respective portion of the first glass material layer forming a cover glass over the aperture of the second glass material layer.

11. The method of claim 10, wherein the dicing step comprises:
(a) sawing through the first glass material layer, but not through the second glass material layer or the semiconductor wafer, along lines between respective tie bars and adjacent portions of the rectangular perimeters of bonding material such that the sawing does not cut through any of the tie bars;
(b) after step (a), sawing through the first glass material layer, but not through the second glass material layer or the semiconductor wafer, along lines between respective pairs of adjacent tie bars without sawing through any of the tie bars; and
singulating each die by cutting through the second glass material layer and through the semiconductor wafer.

12. An apparatus, comprising:
a first glass material layer; and
a second material layer bonded to the first glass material layer via bonding material, wherein the bonding material is formed from one of glass frit material, ceramic frit material, glass ceramic frit material, and metal paste, which has been melted and cured, wherein a flatness of the bonded first and second glass material layers is one of: (i) about 0.75 µm per mm or better; and (ii) about 0.4 µm per mm or better.

13. The apparatus of claim 12, wherein the bond between the first and second glass material layers is hermetic.

14. An apparatus, comprising:
a first glass material layer; and
a second material layer bonded to the first glass material layer via bonding material,
wherein the bonding material is formed from one of glass frit material, ceramic frit material, glass ceramic frit material, and metal paste, which has been melted and cured, wherein:
the second glass material layer includes an array of apertures therethrough; and
the bonding material is patterned forming a continuous perimeter around each of the apertures of the second glass material sheet.

15. The apparatus of claim 14, wherein a flatness of the bonded first and second glass material layers is one of: (i) about 0.75 µm per mm or better; and (ii) about 0.4 µm per mm or better.

16. The apparatus of claim 14, wherein the pattern of bonding material and respective apertures forms an X-Y directional array of cells, each cell comprising one of the apertures surrounded by a respective one of the continuous perimeters of bonding material.

17. The apparatus of claim 16, wherein adjacent cells in the X-direction include at least one line of bonding material (tie bar) therebetween.

18. The apparatus of claim 16, wherein:
adjacent cells in the X-direction include at least two parallel lines of bonding material (tie bars) therebetween; and
adjacent cells in the Y-direction do not include any tie bars therebetween.

19. The apparatus of claim 14, further comprising a microelectromechanical system (MEMS) structure disposed in registration with at least one of the apertures.

20. The apparatus of claim 19, further comprising a plurality of the MEMS structures, each such MEMS disposed in registration with a respective one of the apertures.

* * * * *